United States Patent
Komiyama et al.

(10) Patent No.: US 11,322,967 B2
(45) Date of Patent: May 3, 2022

(54) CONTROL DEVICE AND METHOD FOR DISCHARGING A RECHARGEABLE BATTERY

(71) Applicant: TOYOTA MOTOR EUROPE, Brussels (BE)

(72) Inventors: Keita Komiyama, Evere (BE); Yuki Katoh, Brussels (BE)

(73) Assignee: TOYOTA MOTOR EUROPE, Brussels (BE)

( * ) Notice: Subject to any disclaimer, the term of this patent is extended or adjusted under 35 U.S.C. 154(b) by 321 days.

(21) Appl. No.: 16/070,918

(22) PCT Filed: Jan. 29, 2016

(86) PCT No.: PCT/EP2016/051950
§ 371 (c)(1),
(2) Date: Jul. 18, 2018

(87) PCT Pub. No.: WO2017/129259
PCT Pub. Date: Aug. 3, 2017

(65) Prior Publication Data
US 2019/0023148 A1   Jan. 24, 2019

(51) Int. Cl.
*H02J 7/00* (2006.01)
*H01M 10/48* (2006.01)
(Continued)

(52) U.S. Cl.
CPC .......... *H02J 7/00712* (2020.01); *B60L 50/64* (2019.02); *B60L 58/13* (2019.02); *B60L 58/14* (2019.02);
(Continued)

(58) Field of Classification Search
CPC ...... H02J 7/007; H02J 7/0071; H02J 7/00712; H02J 7/00714; H02J 7/00716; H02J 7/00718
See application file for complete search history.

(56) References Cited

U.S. PATENT DOCUMENTS 5,703,469 A    12/1997  Kinoshita
6,054,840 A *  4/2000   Nakanishi ............. H02J 7/0063
                                                          320/118
(Continued)

FOREIGN PATENT DOCUMENTS

EP    1 422 769 A1   5/2004
EP    2 626 763 A1   8/2013
(Continued)

OTHER PUBLICATIONS

Oct. 1, 2019 Office Action issued in Japanese Patent Application No. 2018-539410.
(Continued)

*Primary Examiner* — David V Henze-Gongola
*Assistant Examiner* — Tarikh Kanem Rankine
(74) *Attorney, Agent, or Firm* — Oliff PLC (57) ABSTRACT

A control device for controlling discharging of a rechargeable battery, the control device being configured to: determine the voltage of the battery during discharging of the battery, stop discharging, when the determined voltage falls below a first predetermined lower voltage limit, determine the voltage of the battery after stopping discharging, determine the voltage difference between the first predetermined lower voltage limit and the determined voltage of the battery after stopping discharging, and continue discharging, when the determined voltage difference exceeds a predetermined threshold. A corresponding method controls discharging of a rechargeable battery.

19 Claims, 5 Drawing Sheets

(51) Int. Cl.

| | | |
|---|---|---|
| *H01M 10/42* | (2006.01) | |
| *H02J 7/04* | (2006.01) | |
| *B60L 58/13* | (2019.01) | |
| *B60L 50/64* | (2019.01) | |
| *B60L 58/16* | (2019.01) | |
| *B60L 58/14* | (2019.01) | |
| *G01R 19/165* | (2006.01) | |
| *G01R 31/392* | (2019.01) | |

(52) U.S. Cl.
CPC ........ *B60L 58/16* (2019.02); *G01R 19/16542* (2013.01); *G01R 31/392* (2019.01); *H01M 10/42* (2013.01); *H01M 10/486* (2013.01); *H02J 7/0021* (2013.01); *H02J 7/0026* (2013.01); *H02J 7/0029* (2013.01); *H02J 7/0031* (2013.01); *H02J 7/0047* (2013.01); *H02J 7/0077* (2013.01); *H02J 7/0086* (2013.01); *H02J 7/045* (2013.01); *H01M 2220/20* (2013.01); *H02J 7/0048* (2020.01); *H02J 7/0049* (2020.01); *H02J 7/00302* (2020.01); *H02J 7/00306* (2020.01); *Y02T 10/70* (2013.01)

(56) References Cited

U.S. PATENT DOCUMENTS

| | | | | |
|---|---|---|---|---|
| 6,300,763 | B1* | 10/2001 | Kwok | G01R 31/367 324/427 |
| 2005/0083017 | A1* | 4/2005 | Suzuki | B60L 58/12 320/128 |
| 2007/0138998 | A1* | 6/2007 | Togashi | B60L 58/25 320/104 |
| 2007/0145949 | A1* | 6/2007 | Matsushima | H02J 7/00 320/132 |
| 2009/0160403 | A1* | 6/2009 | Takeno | G01R 31/392 320/134 |
| 2010/0085010 | A1* | 4/2010 | Suzuki | H01M 10/486 320/132 |
| 2011/0206968 | A1* | 8/2011 | Nishimura | H01M 10/6557 429/120 |
| 2012/0049802 | A1 | 3/2012 | Barsukov et al. | |
| 2012/0112754 | A1* | 5/2012 | Kawai | B60L 58/13 324/428 |
| 2012/0146616 | A1* | 6/2012 | Yamashita | H02J 7/00308 323/351 |
| 2012/0161708 | A1* | 6/2012 | Miura | B60L 50/16 320/118 |
| 2012/0176095 | A1* | 7/2012 | Okuda | H02J 7/0071 320/134 |
| 2012/0176097 | A1* | 7/2012 | Takezawa | H01M 10/48 320/134 |
| 2012/0212184 | A1* | 8/2012 | Klein | H02J 7/0091 320/134 |
| 2012/0296586 | A1* | 11/2012 | Kirchev | G01R 31/392 702/63 |
| 2013/0090900 | A1* | 4/2013 | Gering | G01R 31/392 703/2 |
| 2013/0106356 | A1* | 5/2013 | Nakao | B60L 58/21 320/118 |
| 2013/0113416 | A1* | 5/2013 | Ishibashi | H02J 7/00 320/107 |
| 2013/0113437 | A1* | 5/2013 | Ishibashi | H02J 7/008 320/136 |
| 2013/0187466 | A1* | 7/2013 | Sakai | H02J 7/0021 307/52 |
| 2014/0139192 | A1* | 5/2014 | Berkowitz | H02J 7/00 320/141 |
| 2014/0312912 | A1* | 10/2014 | Berkowitz | H01M 10/44 324/426 |
| 2015/0001932 | A1* | 1/2015 | Inoue | H02J 7/00 307/24 |
| 2015/0137715 | A1* | 5/2015 | Brotto | G01R 31/374 318/139 |
| 2015/0137822 | A1* | 5/2015 | Joe | H01M 10/48 324/426 |
| 2015/0153417 | A1* | 6/2015 | Maluf | G01R 31/388 324/426 |
| 2015/0155734 | A1* | 6/2015 | Ghantous | H02J 7/00 320/107 |
| 2015/0270710 | A1 | 9/2015 | Carver et al. | |
| 2015/0380957 | A1* | 12/2015 | Ghantous | G01R 31/36 320/134 |
| 2016/0006278 | A1* | 1/2016 | Sakakibara | H02J 7/0019 320/112 |
| 2016/0181833 | A1* | 6/2016 | Araki | G01R 31/392 320/134 |
| 2016/0211677 | A1* | 7/2016 | Kobayashi | H02J 7/0026 |
| 2017/0126043 | A1* | 5/2017 | Yoshida | H02J 7/0063 |

FOREIGN PATENT DOCUMENTS

| | | |
|---|---|---|
| EP | 2 793 038 A2 | 10/2014 |
| JP | 2004-355953 A | 12/2004 |
| JP | 2007-005434 A | 1/2007 |
| JP | 2011-045182 A | 3/2011 |
| JP | 2014-003777 A | 1/2014 |
| WO | 2007/016661 A2 | 2/2007 |
| WO | 2011/001266 A2 | 1/2011 |

OTHER PUBLICATIONS

Oct. 12, 2020 Office Action issued in Chinese Patent Application No. 201680080285.1.

* cited by examiner

CONTROL DEVICE AND METHOD FOR DISCHARGING A RECHARGEABLE BATTERY

FIELD OF THE DISCLOSURE

The present disclosure is related to a control device for controlling discharging of a rechargeable battery and also to a method of discharging of a rechargeable battery.

BACKGROUND OF THE DISCLOSURE

Rechargeable batteries, also called secondary cells, have become increasingly important as energy storages, in particular for vehicles. Such vehicles may be hybrid vehicles comprising an internal combustion engine and one or more electric motors or purely electrically driven vehicles. When the vehicle is driven by electrical power, the battery is discharged.

A suitable rechargeable battery for such a vehicle may be a solid-state bipolar battery or other, e.g. liquid type batteries, in particular a laminated Li-ion battery. The rechargeable battery may be realized by a single cell or it may include a set of preferably identical cells. In the latter case the battery is also called a battery pack.

The battery or the battery pack may further include a control device for controlling charging and/or discharging. The control device monitors state of charge (SOC) of the battery and it shall avoid the battery from operating outside its safe operating area. Such a battery or battery pack is also called smart battery/smart battery pack. It is also possible that the control device is provided by the vehicle.

One important aspect of charge/discharge control is to assure that any overcharging and/or over-discharging of the battery is avoided. For this purpose the battery voltage may be monitored, which is increasing during charging and decreasing during discharging. In case the determined battery voltage falls under a predetermined lower voltage limit during discharging, it is recognized by the control device that the battery is fully discharged and discharging is stopped.

However, during the lifetime of a battery the charging and discharging procedures may lead to a degradation of the laminated layers of the battery. In particular the laminated electrodes may be affected by the degradation. The degradation leads to increased resistance which in turn decreases the measured voltage of the battery during discharging.

As a result, when discharging a battery with lamination degradation, the measured voltage reaches the predetermined upper voltage limit sooner, and the control device erroneously recognizes that the battery is fully discharged. Although the battery is actually not yet fully discharged (not at the lower limit of allowed SOC range), discharging is finished. This means that the available amount of energy decreases due to the degradation dispersion.

EP 1 422 769 (A1) discloses a laminated stack type battery with unit cell voltage measurement tabs. A plurality of unit cells stacked in a stack direction are connected in series and shared voltage measurement tab electrodes are formed on the plurality of unit cells, respectively, in order measure voltages for the plurality of unit cells.

However, in the above technology for each cell a single voltage measurement tab electrode is needed. In case of a battery with several hundred cells, such a sensor arrangement can become very expensive or even impossible to be realized.

SUMMARY OF THE DISCLOSURE

Currently, it remains desirable to provide a control device which provides a reliable and economic discharging control function and which is suitable for different battery types.

Therefore, according to embodiments of the present disclosure, a control device is provided for controlling discharging of a rechargeable battery. The control device is configured to:
determine the voltage of the battery during discharging of the battery,
stop discharging, when the determined voltage falls under a first predetermined lower voltage limit,
determine the voltage of the battery after stopping discharging,
determine the voltage difference between the first predetermined lower voltage limit and the determined voltage of the battery after stopping discharging, and
continue discharging, when the determined voltage difference exceeds a predetermined threshold.

By providing such a configuration it is possible to control discharging based on the determined voltage increment of the battery when the discharging is stopped. Such a voltage increment is relatively high, in case the battery has already suffered from lamination degradation, as the degradation leads to a higher resistance and thus to a lower voltage of the battery during discharging. In other words, if the voltage increment is higher than the predetermined threshold, it can be determined that the relatively low voltage of the battery during discharging is due to lamination degradation and not due to an actually discharged state of the battery. In this case discharging is continued.

The first predetermined lower voltage limit may be determined based on the desired usage range of state of charge used by the vehicle. For example the first predetermined lower voltage limit may be set such that a lower state of charge, e.g. of SOC20%, is reached or expected to be reached, when the first predetermined lower voltage limit is reached.

The control device and the procedure performed by the control device are suitable for all types of solid-state bipolar batteries. However, the control device may also be applied to other battery types, like liquid type batteries, as e.g. Li-ion batteries.

The control device may further be configured to, when the determined voltage difference exceeds the predetermined threshold, replace the first predetermined lower voltage limit by a second predetermined lower voltage limit being smaller than the first predetermined lower voltage limit and restart discharging of the battery. Preferably the control device may further be configured to determine in this case the voltage of the battery during discharging of the battery, and, when the voltage falls below the second predetermined lower voltage limit or the lower limit of a predetermined allowed state of charge range of the battery is reached, determine that the battery is fully discharged and reset the predetermined threshold.

In this way discharging can be continued in a suitable extent by decreasing the predetermined lower voltage limit. Discharging may be stopped, when the determined voltage exceeds the decremented predetermined lower voltage limit. However, in case the lower limit of a predetermined allowed state of charge (SOC) range of the battery, e.g. 10% SOC, is reached before, discharging may be stopped, as well. Accordingly "fully discharged" does not mean that the battery is physically fully discharged, i.e. 0% SOC, what could harm the battery and is therefore to be avoided. The lower limit of the allowed SOC range may be chosen such that the battery can be discharged to a maximum extent without risking any dangerous discharging and low voltage of the battery.

Preferably, the control device may hence be configured to set the second predetermined lower voltage limit such that a low voltage of the battery is avoided. In this regard it is noted that the first predetermined lower voltage limit does normally not constitute the actually critical lower voltage limit but is rather chosen such that a battery without degradation can be discharged until the lower limit of a predetermined allowed state of charge range is reached. Therefore this first predetermined lower voltage limit may be decreased, e.g. by 10%, 15%, 20% or 30%, without causing any actually dangerous low voltage. For example, the first predetermined lower voltage limit may be decreased such that the resulting minimum SOC is expected to be still more than 10% or more than 20%.

The control device may further be configured to, when the determined voltage difference does not exceed the predetermined threshold, determine that the battery is fully discharged and reset the predetermined threshold.

In other words, the control device may recognize based on the determined voltage difference, whether the battery is fully discharged or discharging has to be continued. As it will be described in more detail below, the predetermined threshold may be determined each time the battery is discharged. Therefore the predetermined threshold may also be reset, when discharging has been completed.

In particular, the control device may be configured to determine the threshold based on the state of charge of the battery before starting discharging.

In other words the threshold may be determined before starting discharging or when discharging is started. The state of charge of the battery before discharging is started may be less than 100% SOC, e.g. 60% SOC. The determined state of the charge (SOC) before starting discharging may be considered when determining the threshold, as the SOC may have an influence on the determined voltage difference. The threshold namely depends on internal resistance of the battery. Also internal resistance depends on SOC of the battery. Therefore, when the SOC is high, it is preferable to decrease the threshold. In other words, the higher the SOC is before starting discharging, the internal resistance of the battery is decreased and hence the more the threshold may be decreased.

Furthermore the threshold may be determined additionally or alternatively based on a determined degradation of the battery.

The degradation of the battery may be determined based on a temperature/frequency distribution of the battery and a predetermined degradation rate of the battery.

The determination of the degradation of the battery may be based on the Arrhenius equation.

The temperature/frequency distribution of the battery may be determined by recording for each temperature of the battery how much time is the battery had this temperature during its lifetime.

In other words, the temperature data of the battery may be collected during the life time of the battery, i.e. during its usage and the rests between usages. The temperature/frequency distribution may be established by accumulating for each temperature the battery had during its past life time, how long the battery had this temperature.

Preferably, the control device may comprise a voltage sensor for determining the voltage of the battery. This voltage sensor may also be used for determining the state of charge of the battery. Alternatively the control device may comprise a further voltage sensor for determining the state of charge of the battery.

The control device may comprise a temperature sensor for determining the temperature of the battery.

The disclosure further relates to a battery pack. The battery pack may comprise at least one battery, in particular a solid state bipolar battery, and a control device as described above.

The disclosure further relates to a battery discharging system. Said battery discharging system may comprise at least one battery, in particular a solid state bipolar battery, a discharging device for the battery, and a control device as described above.

According to a further aspect the disclosure relates to a vehicle comprising an electric motor and a battery pack, as described above.

Alternatively the vehicle may comprise an electric motor, at least one battery, in particular a solid state bipolar battery, and in addition a control device, as described above.

Moreover the disclosure relates to a method of controlling discharging of a rechargeable battery. The method comprises the steps of:
  determining the voltage of the battery during discharging of the battery,
  stopping discharging, when the determined voltage falls under a first predetermined lower voltage limit,
  determining the voltage of the battery after stopping discharging,
  determining the voltage difference between the first predetermined lower voltage limit and the determined voltage of the battery after stopping discharging, and
  continuing discharging, when the determined voltage difference exceeds a predetermined threshold.

Preferably, when the determined voltage difference exceeds the predetermined threshold, the first predetermined lower voltage limit may be replaced by a second predetermined lower voltage limit being smaller than the first predetermined lower voltage limit and discharging of the battery may be restarted. Moreover the voltage of the battery during discharging of the battery may be determined, and, when the voltage falls below the second predetermined lower voltage limit, it may be determined that the battery is fully discharged and the predetermined threshold may be reset.

The second lower voltage limit may be set such that a potentially dangerous low voltage of the battery is avoided.

When the determined voltage difference does not exceed the predetermined threshold, it is preferably determined that the battery is fully discharged and the predetermined threshold may be reset.

The threshold may be determined based on the state of charge of the battery before starting discharging.

The threshold may be determined based on a determined degradation of the battery.

The degradation of the battery may be determined based on a temperature/frequency distribution of the battery and a predetermined degradation rate of the battery.

The degradation of the battery may be determined based on the determined voltage difference.

The determination of the degradation of the battery may be based on the Arrhenius equation.

The temperature/frequency distribution of the battery may be determined by recording for each temperature of the battery how much time the battery had this temperature during its lifetime.

The accompanying drawings, which are incorporated in and constitute a part of this specification, illustrate embodiments of the disclosure and together with the description, serve to explain the principles thereof.

DESCRIPTION OF THE EMBODIMENTS

Reference will now be made in detail to exemplary embodiments of the disclosure, examples of which are illustrated in the accompanying drawings. Wherever possible, the same reference numbers will be used throughout the drawings to refer to the same or like parts.

Figure 1:
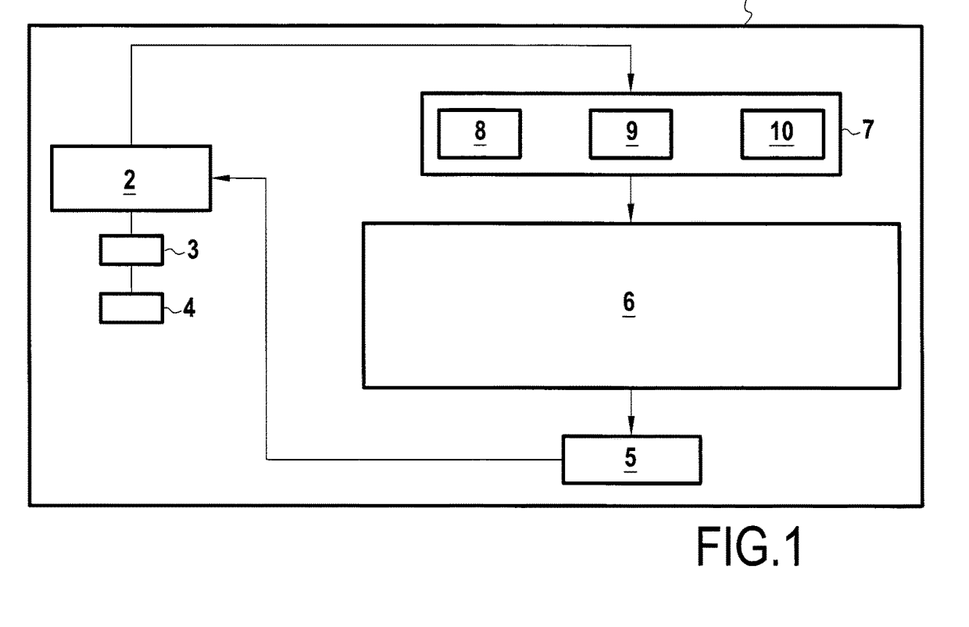
FIG. 1 shows a schematic representation of a vehicle comprising a control device according to an embodiment of the present disclosure.

FIG. 1 shows a schematic representation of a vehicle 1 comprising a control device 6 according to an embodiment of the present disclosure. The vehicle 1 may be a hybrid vehicle or an electric vehicle (i.e. a purely electrically driven vehicle). The vehicle 1 comprises at least one electric motor 4, which is powered by a battery or battery pack 2, preferably via an inverter 3. In case the vehicle is a hybrid vehicle, it further includes an internal combustion engine. The battery 2 may be a solid-state bipolar battery. However, it may also be another battery type, like a liquid type battery, as e.g. a Li-ion battery.

The battery 2 is connected to a discharging device 5 which is configured to discharge the battery 2. The discharging device 5 may comprise an electric control circuit, as e.g. a power electronics circuit. The discharging device 5 may be connected to the electric 4, in particular via the inverter 3. Accordingly, the battery 2 may be discharged, in order to operate the vehicle 1, in particular the electric motor 4. The battery 2 may further be discharged in a battery treatment and/or recovery procedure.

The discharging device may further be configured to charge the battery. For this purpose it may comprise or be connected to a connector for external charging by an external power source. The connector may be e.g. a plug or a wireless connector system. In case the vehicle is a hybrid vehicle, the discharging device 5 may further be connected to the electrical generator of the internal combustion engine of the vehicle. Consequently, the battery 2 may be charged, when the internal combustion engine is operating and/or when the vehicle is connected to an external power source.

In order to control charging and discharging, the vehicle 2 is provided with the control device 6 and sensors 7. For this purpose the control device 6 monitors the battery 2 via the sensors 7 and controls the discharging device 5. The control device 6 and/or the sensors 7 may also be comprised by the battery 2. The control device may be an electronic control circuit (ECU). It may also comprise a data storage. It is also possible that the vehicle comprises a smart battery charging system with a smart battery and a smart charging device. In other words, both the battery and the vehicle may comprise each an ECU which operate together and form together the control device according to the invention. Furthermore the control device 6 may comprise or may be part of a battery management system.

The control device 6 may comprise an application specific integrated circuit (ASIC), an electronic circuit, a processor (shared, dedicated, or group), a combinational logic circuit, a memory that executes one or more software programs, and/or other suitable components that provide the described functionality of the control device 6.

The sensors 7 may comprise one or more temperature sensors 8 for measuring the temperature of the battery 2, an SOC (state of charge) sensor 9 for measuring the state of charge of the battery 2 and a voltage sensor 10 for measuring the voltage of the battery. The SOC sensor 9 may also be a voltage sensor, wherein the measured voltage is used to determine the SOC of the battery. In this case the SOC sensor may be the same sensor as the voltage sensor 10 or it may be an additional sensor. Of course, the SOC sensor 9 may also comprise other sensor types to determine the SOC of the battery, as it is well known in the art.

Figure 2:
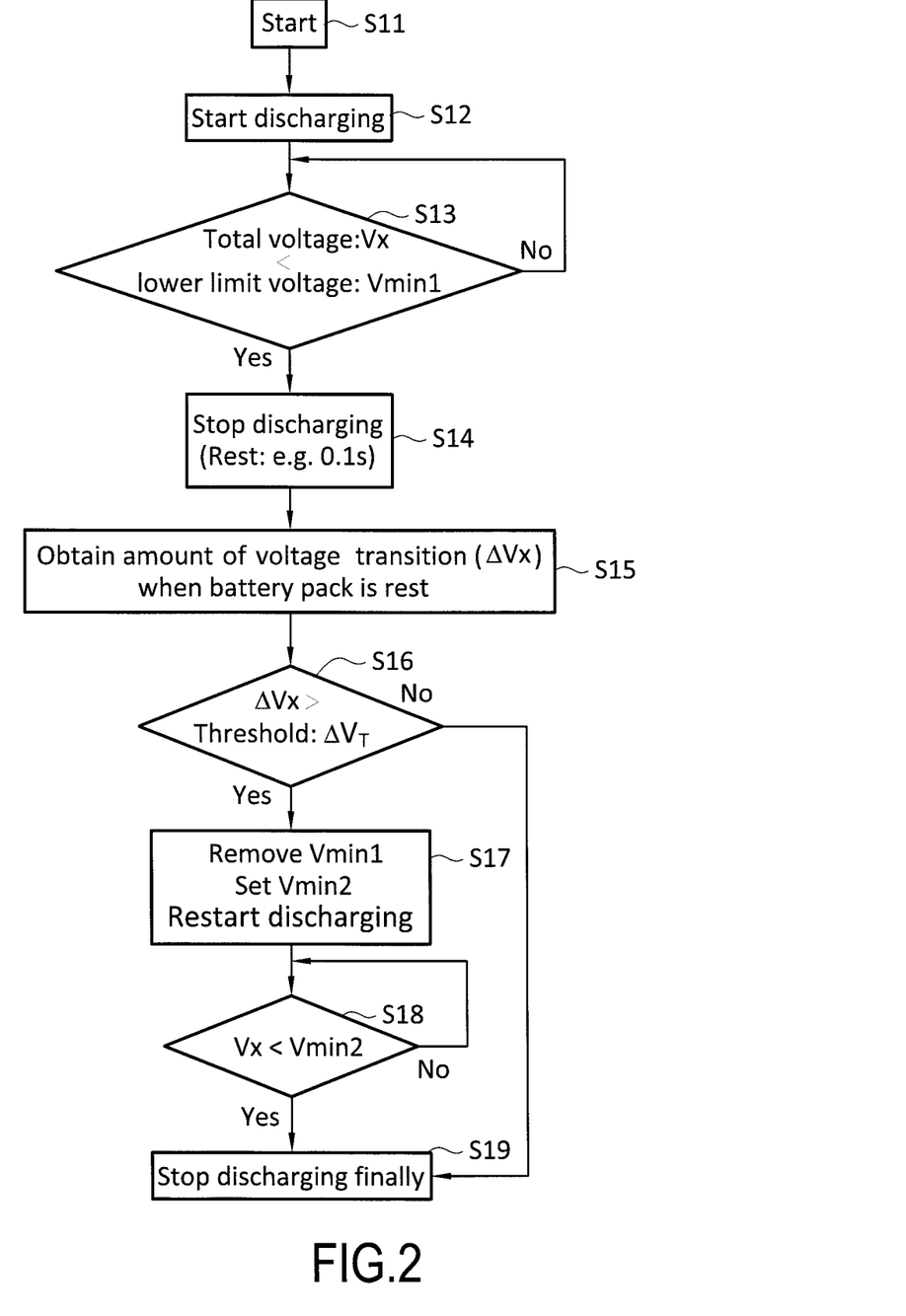
FIG. 2 shows a flow chart of the general discharging control procedure according to an embodiment of the present disclosure.

FIG. 2 shows a flow chart of the general discharging control procedure according to an embodiment of the present disclosure. The control device 6 is configured to carry out this procedure of FIG. 2.

In step S11 the procedure is started. The start may be triggered by a determination of the control device that discharging of the battery becomes necessary (e.g. due to operation of the electric motor 4). Moreover in step S11 the threshold $\Delta V_T$ may be determined. This determination procedure is described in detail in the following, in particular in context of FIGS. 3 and 4.

In step S12 discharging of the battery is started.

In step S13 the voltage $V_x$ of the battery is measured, preferably during discharging. Hence, the voltage $V_x$ is monitored, preferably continuously. It is then determined, whether the measured voltage $V_x$ of the battery falls under a first predetermined lower voltage limit $V_{min1}$. If it does not, discharging is continued. However, if the measured voltage $V_x$ of the battery is lower than the first predetermined lower voltage limit $V_{min1}$, the method continues with step S14. Accordingly, the voltage $V_x$ of the battery continuously decreases during discharging and discharging is stopped, when $V_x$ exceeds $V_{min1}$.

Said first predetermined lower voltage limit $V_{min1}$ is preferably dependant on the battery type and is determined by pre-experiment. The control device may receive respective information from the battery, e.g. directly the value of $V_{min1}$ of the battery or any ID of the battery. In the latter case the control device may look up in a data storage the battery specific value of $V_{min1}$ based on the received ID. The same may apply for a second predetermined lower voltage limit $V_{min2}$ which will be explained below in context of step S17. It is further noted that $V_{min1}$, $V_{min2}$ and $V_x$ are preferably absolute (i.e. positive) values.

In step S14 discharging is stopped at least for a limited time, as e.g. maximally 0.02 s, 0.05 s, 0.1 s or 0.2 s. Preferably also charging may be stopped for this time. In a conventional discharging control procedure discharging would be finally stopped in step S14, even if the battery was actually not fully discharged.

In step S15 the voltage $V_x$ of the battery is measured again, however now in the state that discharging (and eventually even charging) is stopped due to the discharging interruption started in S14. Then the voltage difference $\Delta V_x$ between the first predetermined lower voltage limit $V_{min1}$ and the voltage $V_x$ measured in step S15 after stopping discharging. Since the voltage $V_x$ measured in step S15 is regularly higher the first predetermined lower voltage limit $V_{min1}$, $\Delta V_x$ is a voltage increment.

Alternatively the voltage difference $\Delta V_x$ may also be the difference between the voltage $V_x$ which has been measured last during discharging in step S13, i.e. directly before stopping discharging, and the voltage $V_x$ measured in step S15 after stopping discharging.

This voltage increment is at least partially due to a lamination degradation of the battery, as the degradation leads to a higher resistance and thus to a lower voltage of the battery during discharging. It can be consequently determined that, if the voltage increment is relatively high, there is lamination degradation which has caused the measured voltage during discharging in step S13 to be below the first predetermined lower voltage limit $V_{min1}$.

In step S16 it is determined, whether the determined voltage difference $\Delta V_x$ exceeds the predetermined threshold $\Delta V_T$. In case it does not, it is determined that discharging is completed and hence discharging is stopped finally in step S19. However, in case $\Delta V_x$ exceeds $\Delta V_T$, The procedure continues with step S17. It is noted that $\Delta V_x$ and $\Delta V_T$ are preferably absolute (i.e. positive) values.

In step S17 the first lower voltage limit $V_{min1}$ is replaced by a smaller second lower voltage limit $V_{min2}$. In particular, the lower voltage limit $V_{min1}$ may be decreased by a predetermined decrement, e.g. by 0.1V, 0.2V, 0.5V, 1V or 2V, in order to obtain the second predetermined lower voltage limit $V_{min2}$. Then discharging is restarted.

In step S18 the voltage $V_x$ of the battery is measured (i.e. monitored), preferably during discharging. It is then determined, whether the measured voltage $V_x$ of the battery falls under the second predetermined lower voltage limit $V_{min2}$. If it does not, discharging is continued. However, if the measured voltage $V_x$ of the battery is lower than the second predetermined lower voltage limit $V_{min2}$, discharging is finally stopped in step S19.

Preferably, the second predetermined lower voltage limit $V_{min2}$ is reset to its initial value $V_{min1}$, when discharging is stopped finally in step S19.

Figure 3:
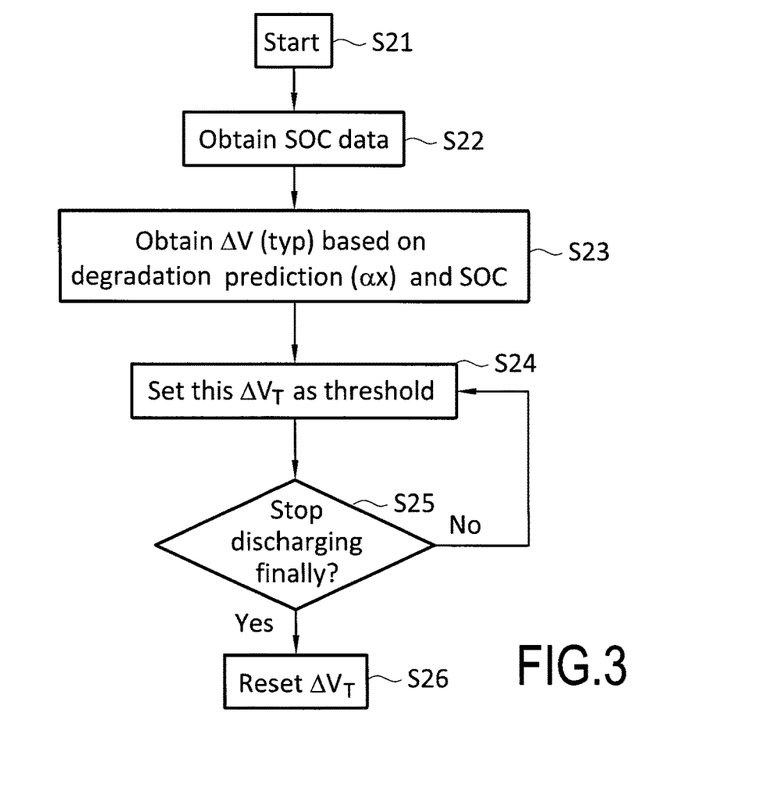
FIG. 3 shows a flow chart of the procedure for determining a threshold according to an embodiment of the present disclosure.

FIG. 3 shows a flow chart of the procedure for determining a threshold $\Delta V_T$ according to an embodiment of the present disclosure.

The procedure of FIG. 3 is preferably started together with the procedure of FIG. 2 and more preferably its steps S21 to S24 are carried out in step S11 of the procedure of FIG. 2.

In step S22 SOC (state of charge) data of the battery are determined. For this purpose the SOC sensor 9 may be used, as described above.

In step S23 the threshold $\Delta V_T$ is determined based on the determined SOC and the currently determined degradation $\alpha_x$ of the battery. The determination of $\alpha_x$ is described in detail below in context of FIG. 4. In step S24 the determined threshold $\Delta V_T$ is set as threshold, as used in step S16 of FIG. 2.

In step S25 it is monitored whether discharging has been stopped finally, what corresponds to step S19 in FIG. 2. If this is the case, the threshold $\Delta V_T$ is reset in step S26. Accordingly, at each discharging procedure (which corresponds to running the procedure of FIG. 2) the threshold $\Delta V_T$ is set once in the beginning. Consequently for a subsequent discharging procedure the threshold $\Delta V_T$ is newly determined, so that the current degradation $\alpha_x$ of the battery and the current SOC can be considered, when the subsequent discharging procedure is started.

Figure 4:
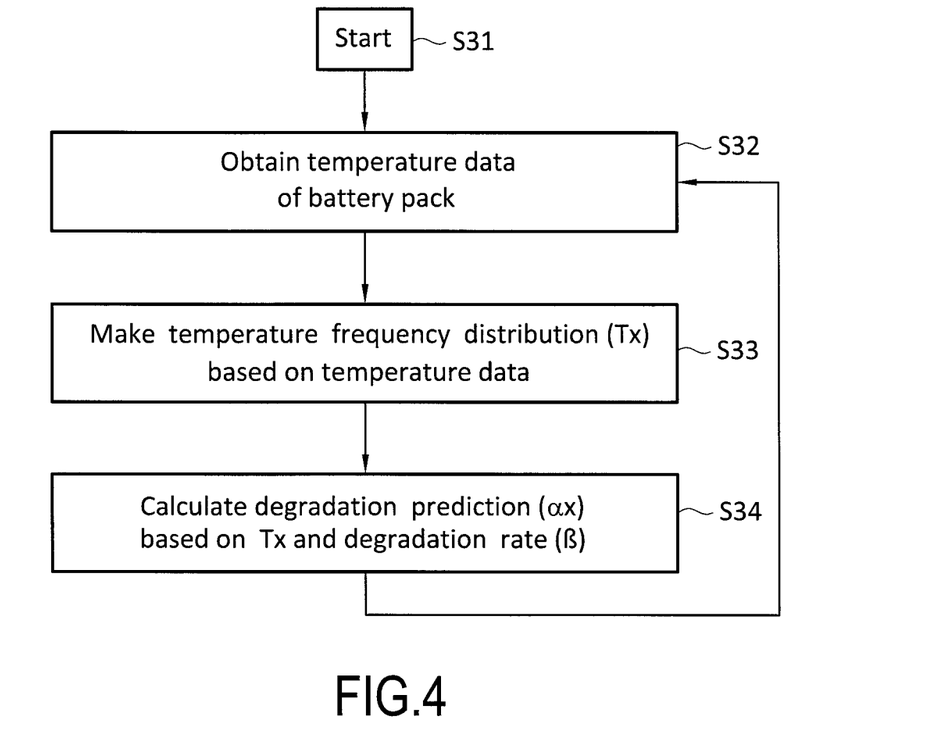
FIG. 4 shows a flow chart of the procedure for determining the degradation of a battery according to an embodiment of the present disclosure.

FIG. 4 shows a flow chart of the procedure for determining the degradation $a_x$ of a battery according to an embodiment of the present disclosure. This procedure is preferably carried out in or before step S23 of FIG. 3, so that the threshold $\Delta V_T$ is always determined based on a currently updated degradation $\alpha_x$. In this context it is also noted that the determined degradation $\alpha_x$ rather represents an estimation of the actual degradation of the battery.

In step S32 temperature data of battery are obtained. For this purpose the temperature sensor 8 may be used. However, these data may include not only the current temperature of the battery, but also historic temperature data since the last time the procedure of FIG. 4 has been carried out, in particular since the last time the temperature frequency distribution $T_x$ has been updated (cf. step S33).

In step S33 the temperature frequency distribution $T_x$ is established or, in case a temperature frequency distribution $T_x$ already exists, it is updated. For this purpose the collected temperature data obtained in step S32 are accumulated, wherein the accumulated time for each measured temperature is expressed as its inverse, i.e. as frequency. The temperature frequency distribution $T_x$ is described in more detail below in context of FIG. 6.

In step S34 the degradation $\alpha_x$ of the battery is determined based on the temperature frequency distribution $T_x$ and the predetermined battery-type specific degradation rate $\beta$. This determination, i.e. calculation, is described in the following with reference to FIGS. 5 and 6.

Basically the calculation of the degradation $\alpha_x$ is based on the Arrhenius equation, as generally known in the art. The degradation $\alpha_x$ is calculated by $$\alpha x = c \times \exp\left(\frac{b}{t}\right) \times t$$

wherein:
t=time
c=ln(A)
b=−(E/R)
T=Temperature

The current degradation $\alpha_x$ is thereby an accumulated value, i.e. the currently calculated degradation and the sum of all formerly calculated degradations, as e.g.:

$$\alpha x1 = \alpha_1 + \alpha_2 + \alpha_3 \ldots$$

with:

$$\alpha_1 = c \times \exp\left(\frac{b}{T_1}\right) \times t_1$$

Figure 6:
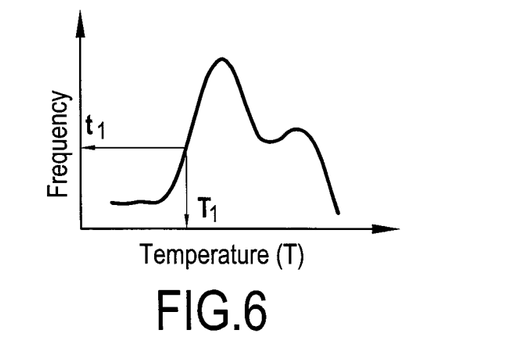
FIG. 6 shows an exemplary and schematic diagram of a determined temperature/frequency distribution of a battery.

The values for the temperature T and for the time t can thereby be derived from the temperature frequency distribution $T_x$ as shown in FIG. 6. The further parameters c and b are predetermined in context of the determination of the degradation rate β.

The degradation rate β is calculated based on the equation:

$$k = A\exp\left(-\frac{E_a}{RT}\right)$$

wherein:
k=predetermined reaction rate constant (or rate constant)
A=constant
$E_a$=activation energy
R=gas constant
T=Temperature The parameters k, A, Ea and R are known by pre-experiment of the specific battery type of the used battery or are generally known parameters.

When k⇒β:

$$\ln(\beta) = \ln(A) - \left(\frac{E}{R}\right) \times \frac{1}{T}$$

Accordingly, the parameters b and c for the calculation of degradation $\alpha_x$ can be determined by:
b=−(E/R)
c=ln(A)

Figure 5:
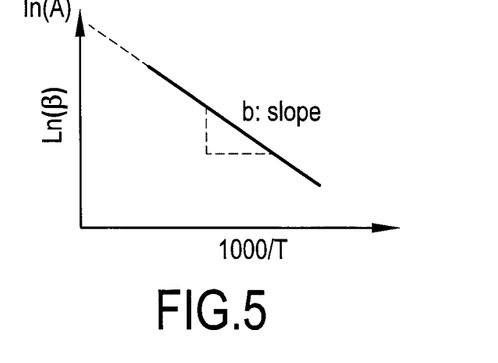
FIG. 5 shows an exemplary and schematic diagram of a predetermined degradation rate in relation to the temperature of a battery.

The resulting diagram of the degradation rate β is shown in FIG. 5. The degradation rate β is predetermined and specific for the battery-type of the used battery. The degradation rate β is preferably determined in pre-experiment and is known by the battery (in case of a smart battery) and/or by the control device.

The threshold $\Delta V_T$ is preferably mapped to the determined degradation $\alpha_x$ in a look-up map, i.e.:
$\alpha_{x1} \Rightarrow \Delta V_{T1}$
$\alpha_{x2} \Rightarrow \Delta V_{T2}$
$\alpha_{x3} \Rightarrow \Delta V_{T3}$
etc.

This relation between $\Delta V_T$ and αx is preferably determined in a pre-experiment and is specific for the battery-type of the used battery. The look-up map may be stored in a data storage of the control-device or of the battery (in case of a smart battery).

Preferably also the determined SOC of the battery is considered when determining $\Delta V_T$. The control device may also have information regarding the relationship between SOC and $\Delta V_T$ such as in the above-mentioned look-up map of αx. For example in said look-up map an additional column for SOC values may be added.

FIG. 5 shows an exemplary and schematic diagram of a predetermined degradation rate in relation to the temperature of a battery. As it can be seen the values of the parameters b and c can be directly derived from this diagram, as b is the slope of the linear function and c is the intercept of the (elongated) linear function with the Y-axis.

FIG. 6 shows an exemplary and schematic diagram of a determined temperature/frequency distribution of a battery. In the diagram the x-axis represents the temperature T of the battery and the y-axis represents the frequency, i.e. the inverse of the time. The diagram contains the accumulated temperature data of the battery over its whole life time, i.e. over the whole time the battery has been used and the rest times between the usages. In order to establish the diagram, i.e. the illustrated curve, it is determined for each temperature the battery had during its life time, e.g. from −40° C. to +60° C. in (quantized) steps of 1° C., how much time the battery had each of these temperatures. The accumulated time is thereby expressed by its inverse, i.e. by a frequency.

Figure 7:
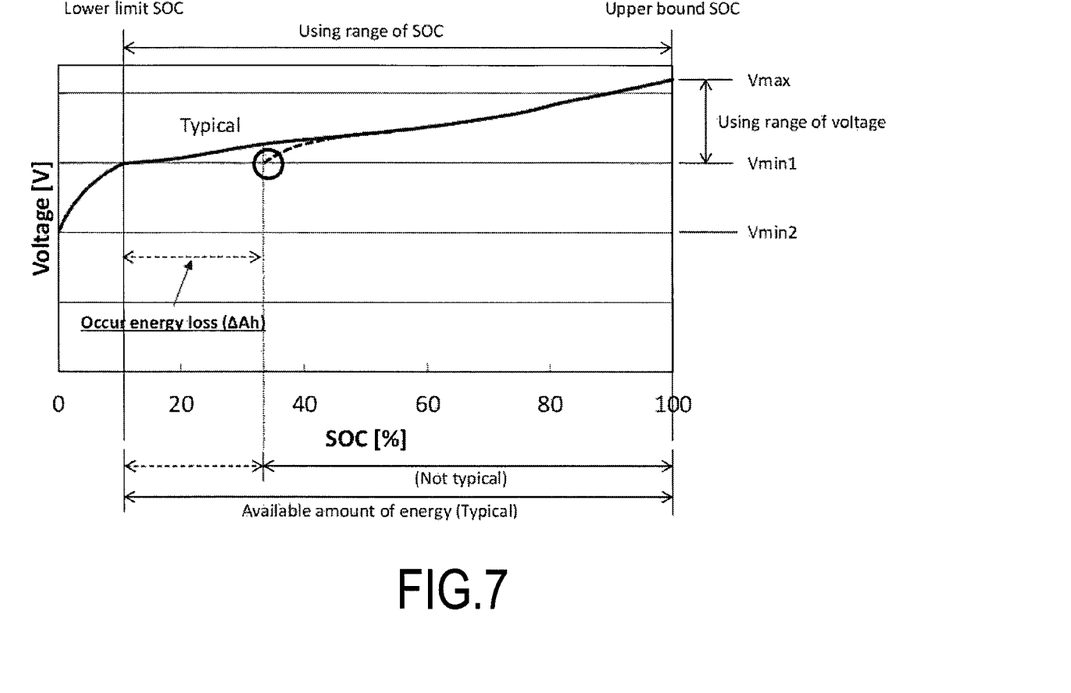
FIG. 7 shows an exemplary and schematic voltage—SOC diagram of a battery, when a conventional discharging control is applied.

FIG. 7 shows an exemplary and schematic voltage—SOC diagram of a battery, when a conventional discharging control is applied. As it can be seen the voltage $V_x$ of the battery decreases during discharging, i.e. it decreases with a decreasing SOC of the battery.

The continuous line thereby represents a battery without any degradation, e.g. a new battery. The measured voltage $V_x$ of such a battery reaches during discharging the first lower voltage limit $V_{min1}$, when the SOC reaches its lower limit of the allowed SOC range, e.g. 10% SOC. As an effect, it is correctly determined that discharging is completed and discharging is stopped. The first lower voltage limit $V_{min1}$ thereby represents the conventionally used lower voltage limit.

The dashed line represents a battery with lamination degradation, e.g. a used battery. The measured voltage $V_x$ of such a battery decreases more strongly during discharging due to the higher resistance caused by the lamination degradation. The voltage $V_x$ therefore reaches already the (conventional) first lower voltage limit $V_{min1}$, when the SOC is about 35%. As an effect, it is erroneously determined that discharging is completed, i.e. the battery is fully discharged in its allowed SOC range, and discharging is stopped. This can be avoided by the invention as described in context of FIGS. 8 and 9.

Figure 8:
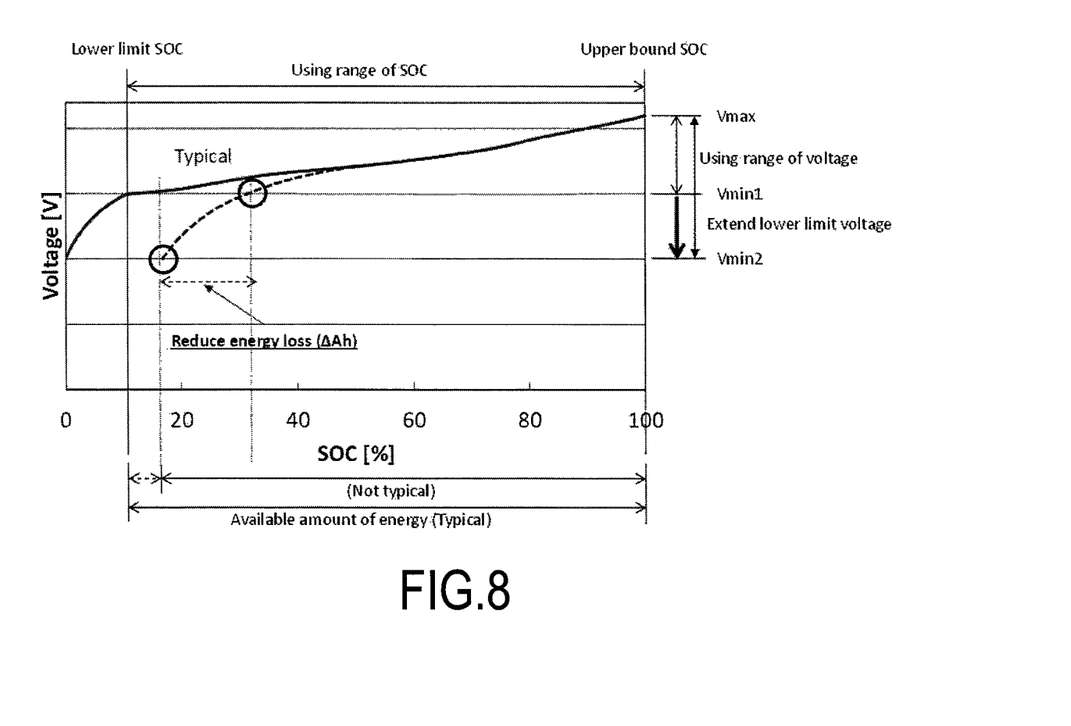
FIG. 8 shows a first exemplary and schematic voltage—SOC diagram of a battery, when a discharging control according to an embodiment of the present disclosure is applied.

FIG. 8 shows a first exemplary and schematic voltage—SOC diagram of a battery, when a discharging control according to an embodiment of the present disclosure is applied. FIG. 8 illustrates the same case as FIG. 7, i.e. a (new) battery without any degradation and a (used) battery having a lamination degradation. Both curves decrease until they reach the initial first lower voltage limit $V_{min1}$. The dashed line representing a battery with lamination degradation thereby reaches the first lower voltage limit $V_{min1}$, when the SOC is about 35%.

However, before stopping discharging completely, it is determined whether the voltage difference $\Delta V_x$ exceeds a predetermined threshold $\Delta V_T$, as described above in context of step S16 of FIG. 2. In case a lamination degradation has been recognized by determining that $\Delta V_x$ exceeds $\Delta V_T$, the first lower voltage limit $V_{min1}$ is decreased to the second lower voltage limit $V_{min2}$ (being lower than the first lower voltage limit $V_{min1}$) and discharging is continued. Hence, discharging can be continued until the voltage $V_x$ of the battery falls under the decreased second lower voltage limit $V_{min2}$. In the example of FIG. 8, the battery can be discharged in this way until approximately 17% SOC is reached. Accordingly, compared to conventional discharging, the energy loss due to degradation can be reduced from approximately 25% SOC to approximately 7% SOC (assuming that the lower limit of the allowed SOC range is 10% SOC). Of course, the decreased second lower voltage limit $V_{min2}$ should still be high enough such that any actually dangerous low voltage can be avoided.

Figure 9:
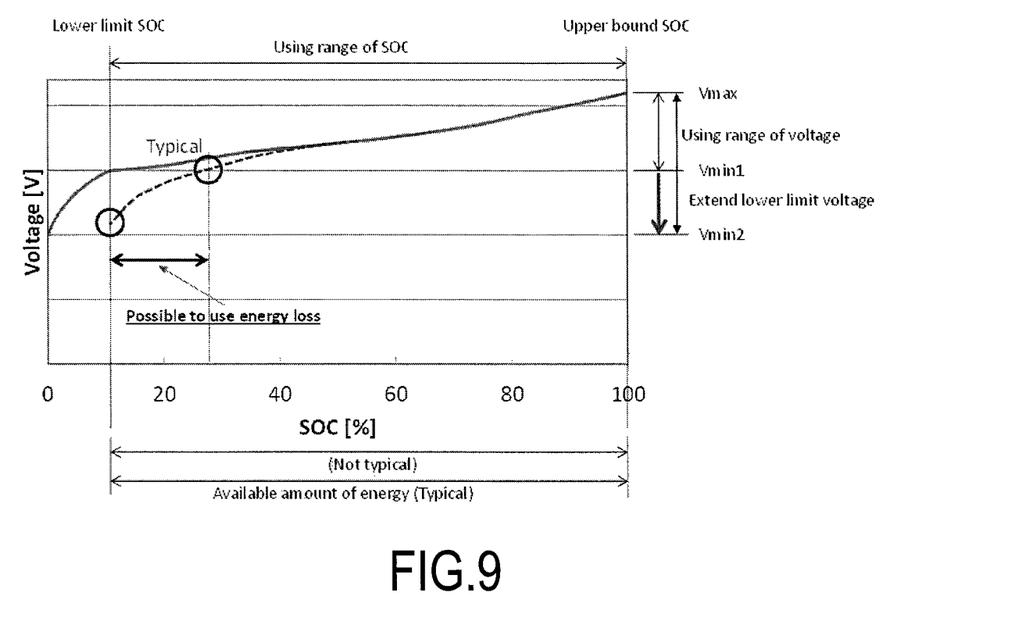
FIG. 9 shows a second exemplary and schematic voltage—SOC diagram of a battery, when a discharging control according to an embodiment of the present disclosure is applied.

FIG. 9 shows a second exemplary and schematic voltage—SOC diagram of a battery, when a discharging control according to an embodiment of the present disclosure is applied. FIG. 9 illustrates a (new) battery without any degradation and a (used) battery having a lamination degradation. Both curves decrease until they reach the initial first lower voltage limit $V_{min1}$. The dashed line representing a battery with lamination degradation thereby reaches the first lower voltage limit $V_{min1}$, when the SOC is about 28%.

However, before stopping discharging completely, it is determined whether the voltage difference $\Delta V_x$ exceeds a predetermined threshold $\Delta V_T$, as described above in context of step S16 of FIG. 2. In case a lamination degradation has been recognized by determining that $\Delta V_x$ exceeds $\Delta V_T$, the first lower voltage limit $V_{min1}$ is decreased to the second lower voltage limit $V_{min2}$ (being lower than the first lower voltage limit $V_{min1}$) and discharging is continued. Hence, discharging can be continued until the voltage $V_x$ of the battery falls under the decreased second lower voltage limit $V_{min2}$. However, in the example of FIG. 9, the battery reaches first the lower limit of its allowed SOC range which is in this example approximately at 10% SOC. Hence, in this example discharging is finally stopped due to reaching the lower limit of the allowed SOC range of the battery. Accordingly, there is no energy loss due to the degradation.

Throughout the disclosure, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Where any standards of national, international, or other standards body are referenced (e.g., ISO, etc.), such references are intended to refer to the standard as defined by the national or international standards body as of the priority date of the present specification. Any subsequent substantive changes to such standards are not intended to modify the scope and/or definitions of the present disclosure and/or claims.

Although the present disclosure herein has been described with reference to particular embodiments, it is to be understood that these embodiments are merely illustrative of the principles and applications of the present disclosure.

It is intended that the specification and examples be considered as exemplary only, with a true scope of the disclosure being indicated by the following claims.

The invention claimed is:

1. A control device for controlling discharging of a rechargeable battery, the control device being configured to:
   monitor:
     a discharging device configured to discharge the battery;
     a voltage sensor configured to measure a voltage of the battery, including during discharge of the battery;
     a temperature sensor configured to determine a temperature of the battery; and
     a state of charge sensor configured to measure a state of charge of the battery;
   determine a state of charge of the battery based on the measurement of the state of charge sensor;
   set a first predetermined lower voltage limit based on the state of charge and a degradation of the battery, such that the first predetermined lower voltage limit is set lower as the state of charge is higher, and lower as the degradation is lower;
   cause the discharging device to start discharging the battery, after determining the first predetermined lower voltage limit;
   determine a first voltage of the battery based on the measurement of the voltage sensor;
   cause the discharging device to stop discharging, when the first voltage falls below the first predetermined lower voltage limit;
   determine a second voltage of the battery based on the measurement of the voltage sensor after the discharging device stops discharging;
   determine a voltage difference between the first predetermined lower voltage limit and the second voltage; and
   cause the discharging device to continue discharging, when the determined voltage difference exceeds a predetermined threshold.

2. The control device according to claim 1, further configured to, when the determined voltage difference exceeds the predetermined threshold:
   replace the first predetermined lower voltage limit with a second predetermined lower voltage limit smaller than the first predetermined lower voltage limit;
   cause the discharging device to restart discharging of the battery;
   determine a third voltage of the battery based on the measurement of the voltage sensor during the restarted discharging of the battery; and
   when the third voltage falls below the second predetermined lower voltage limit or a lower limit of a predetermined allowed state of charge range of the battery is reached, determine that the battery is fully discharged and reset the predetermined threshold.

3. The control device according to claim 1, further configured to:
   when the determined voltage difference does not exceed the predetermined threshold, determine that the battery is fully discharged and reset the predetermined threshold.

4. The control device according to claim 1, further configured to determine the degradation of the battery based on a temperature / frequency distribution of the battery and a predetermined degradation rate of the battery.

5. The control device according to claim 1, wherein the determination of the degradation of the battery is based on the Arrhenius equation.

6. The control device according to claim 4, further configured to determine the temperature/frequency distribution of the battery based on recording, for each temperature of the battery, how much time the battery had this temperature during its lifetime.

7. The control device according to claim 1, further comprising:
   the voltage sensor.

8. The control device according to claim 1, further comprising:
   the temperature sensor.

9. A battery pack comprising:
   the control device according to claim 1; and
   the battery.

10. A battery discharging system comprising:
    the control device according to claim 1;
    the battery; and
    the discharging device.

11. A vehicle comprising:
    an electric motor; and
    the battery pack according to claim 9.

12. A vehicle comprising:
    an electric motor;
    the control device according to claim 1; and
    the battery.

13. A method of controlling discharging of a rechargeable battery, comprising the steps of:
- providing a control device configured to monitor: a discharge device, a voltage sensor, a temperature sensor, and a state of charge sensor; and
- using the control device:
  - determining a state of charge of the battery based on the measurement of the state of charge sensor;
  - setting a first predetermined lower voltage limit based on the state of charge and a degradation of the battery, such that the first predetermined lower voltage limit is set lower as the state of charge is higher, and lower as the degradation is lower;
  - causing the discharging device to start discharging the battery, after determining the first predetermined lower voltage limit;
  - determining a first voltage of the battery during discharging of the battery based on an output of the voltage sensor;
  - causing the discharging device to stop discharging, when the first voltage falls below the first predetermined lower voltage limit;
  - determining a second voltage of the battery after stopping discharging based on the output of the voltage sensor;
  - determining a voltage difference between the first predetermined lower voltage limit and the second voltage; and
  - causing the discharging device to continue discharging, when the determined voltage difference exceeds a predetermined threshold.

14. The method according to claim 13, further comprising, using the control device, when the determined voltage difference exceeds the predetermined threshold:
- replacing the first predetermined lower voltage limit by a second predetermined lower voltage limit smaller than the first predetermined lower voltage limit;
- causing the discharging device to restart discharging of the battery;
- determining a third voltage of the battery during discharging of the battery; and
- when the third voltage falls below the second predetermined lower voltage limit or a lower limit of a predetermined allowed state of charge range of the battery is reached, determining that the battery is fully discharged and resetting the predetermined threshold.

15. The method according to claim 13, further comprising:
- when the determined voltage difference does not exceed the predetermined threshold, determining that the battery is fully discharged and resetting the predetermined threshold.

16. The method according to claim 13, wherein the degradation of the battery is determined based on a temperature / frequency distribution of the battery and a predetermined degradation rate of the battery.

17. The method according to claim 13, wherein the determination of the degradation of the battery is based on the Arrhenius equation.

18. The method according to claim 16, wherein the temperature/frequency distribution of the battery is determined based on recording, for each temperature of the battery, how much time the battery had this temperature during its lifetime.

19. A control device for controlling discharging of a rechargeable battery, the control device being configured to:
- determine a state of charge of the battery based on the measurement of a state of charge sensor;
- set a first predetermined lower voltage limit based on the state of charge and a degradation of the battery, such that the first predetermined lower voltage limit is set lower as the state of charge is higher, and lower as the degradation is lower;
- cause a discharging device to start discharging the battery, after determining the first predetermined lower voltage limit;
- determine a first voltage of the battery during discharging of the battery;
- stop discharging, when the determined voltage falls below the first predetermined lower voltage limit;
- determine a second voltage of the battery after stopping discharging;
- determine a voltage difference between the first predetermined lower voltage limit and the second voltage; and
- when the determined voltage difference exceeds a predetermined threshold:
  - continue discharging;
  - replace the first predetermined lower voltage limit with a second predetermined lower voltage limit smaller than the first predetermined lower voltage limit;
  - restart discharging of the battery;
  - determine a third voltage of the battery during discharging of the battery; and
  - when the third voltage falls below the second predetermined lower voltage limit or a lower limit of a predetermined allowed state of charge range of the battery is reached, determine that the battery is fully discharged and reset the predetermined threshold.

* * * * *